United States Patent
Chen et al.

(10) Patent No.: US 10,916,399 B1
(45) Date of Patent: Feb. 9, 2021

(54) ELECTRON GUN AND APPARATUS INCORPORATING THE SAME

(71) Applicant: City University of Hong Kong, Kowloon (HK)

(72) Inventors: Fu-Rong Chen, Kowloon (HK); Pei-En Li, Hsinchu (TW); Ying-Shuo Tseng, Hsinchu (TW); Yu-Chun Hsueh, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/564,195

(22) Filed: Sep. 9, 2019

(51) Int. Cl.
*H01J 29/48* (2006.01)
*H01J 37/28* (2006.01)

(52) U.S. Cl.
CPC .......... *H01J 29/481* (2013.01); *H01J 29/488* (2013.01); *H01J 37/28* (2013.01)

(58) Field of Classification Search
CPC .... H05G 1/08; H05G 1/10; H05G 1/32; H01J 37/241; H01J 37/243; H01J 1/135; H01J 29/62; H01J 29/96; H01J 37/073; H01J 37/242; H01J 37/3007; H01J 3/36
USPC .......... 315/205, 127, 194, 307, 381; 219/121.34, 121.12; 250/396 R, 492.2, 250/492.3; 378/110, 109, 111
See application file for complete search history.

(56) References Cited

U.S. PATENT DOCUMENTS

| 3,072,822 | A | * | 1/1963 | Holmes | H02M 7/2173 315/107 |
| 3,219,929 | A | * | 11/1965 | King | H03G 3/22 324/99 R |
| 3,320,435 | A | * | 5/1967 | Watters | H01J 1/135 327/468 |
| 3,333,057 | A | * | 7/1967 | Berglund | H04N 1/032 358/296 |
| 3,363,240 | A | * | 1/1968 | Cola | G09G 3/06 365/159 |
| 3,403,310 | A | * | 9/1968 | Davidoff | G05D 3/1427 318/626 |
| 3,480,824 | A | * | 11/1969 | Faberes | G11C 11/23 315/12.1 |

(Continued)

FOREIGN PATENT DOCUMENTS

| CN | 103177921 | 6/2013 |
| EP | 0168064 | 1/1986 |
| KR | 790000384 | 5/1979 |

*Primary Examiner* — David A Vanore
(74) *Attorney, Agent, or Firm* — Renner Kenner Greive Bobak Taylor & Weber

(57) ABSTRACT

An electron gun and an apparatus incorporating the electron gun. The electron gun includes an electron emission element, an electrode, a control element, and a control circuit. The electron emission element is arranged to be activated to emit electron beam. The electrode is arranged to be electrically connected with a power supply to accelerate the emitted electron beam. The control element may be arranged between the electron emission element and the electrode. The control element is arranged to be electrically connected with the power supply to provide an electric field to control emission of electron beams from the electron emission element. The control circuit is electrically connected with the control element for changing the electric field provided by the control element.

20 Claims, 3 Drawing Sheets

(56) References Cited

U.S. PATENT DOCUMENTS

| | | | | | |
|---|---|---|---|---|---|
| 3,760,279 | A | * | 9/1973 | Rudolph | H02H 9/02 361/101 |
| 4,199,689 | A | * | 4/1980 | Takigawa | H01J 37/241 219/121.12 |
| 4,315,195 | A | * | 2/1982 | Redel | H01J 37/241 315/107 |
| 4,317,983 | A | * | 3/1982 | Scheffels | H01J 37/242 219/121.34 |
| 4,930,145 | A | * | 5/1990 | Sherwin | H05G 1/32 378/109 |
| 5,272,618 | A | * | 12/1993 | Blake | H02M 3/3378 363/25 |
| 5,401,973 | A | * | 3/1995 | McKeown | H05H 1/0006 250/396 R |
| 5,808,425 | A | * | 9/1998 | Harle | H01J 37/243 315/106 |
| 2003/0147498 | A1 | * | 8/2003 | Hadland | H05G 1/10 378/119 |
| 2005/0285541 | A1 | * | 12/2005 | LeChevalier | H01J 3/36 315/169.3 |
| 2018/0174792 | A1 | * | 6/2018 | Dusberg | H01J 35/065 |

* cited by examiner

| I3 | I2 | I1 | I0 | Equivalent Resistance Across Nodes A and B |
|---|---|---|---|---|
| 1 | 1 | 1 | 1 | 0 |
| 1 | 1 | 1 | 0 | R |
| 1 | 1 | 0 | 1 | 2R |
| 1 | 1 | 0 | 0 | 3R |
| 1 | 0 | 1 | 1 | 4R |
| 1 | 0 | 1 | 0 | 5R |
| 1 | 0 | 0 | 1 | 6R |
| 1 | 0 | 0 | 0 | 7R |
| 0 | 1 | 1 | 1 | 8R |
| 0 | 1 | 1 | 0 | 9R |
| 0 | 1 | 0 | 1 | 10R |
| 0 | 0 | 1 | 0 | 11R |
| 0 | 0 | 1 | 1 | 12R |
| 0 | 0 | 0 | 1 | 13R |
| 0 | 0 | 0 | 0 | 14R |
| 0 | 0 | 0 | 0 | 15R |

Figure 3

ELECTRON GUN AND APPARATUS INCORPORATING THE SAME

TECHNICAL FIELD

The invention relates to an electron gun and an apparatus incorporating the electron gun.

BACKGROUND

Electron guns are devices that can generate a high-energy-density electron beam. These devices are commonly found in cathode ray tubes, vacuum tubes, and scientific apparatuses including electron microscopes and particle accelerators. The electron beam generated has to be precisely controlled to suit particular applications.

SUMMARY OF THE INVENTION

In accordance with a first aspect of the invention, there is provided an electron gun comprising: an electron emission element, an electrode, a control element, and a control circuit. The electron emission element is arranged to be activated to emit electron beam. The electrode is arranged to be electrically connected with a power supply to accelerate the emitted electron beam. The control element may be arranged between the electron emission element and the electrode. The control element is arranged to be electrically connected with the power supply to provide an electric field to control emission of electron beams from the electron emission element. The control circuit is electrically connected with the control element for changing the electric field provided by the control element. In operation the electron emission element acts as a cathode and the electrode act as an anode. The power supply may be a voltage supply. The electrode and the control element may each be connected, directly or indirectly, with a respective terminal of the power supply. By using the same power supply for the electrode and the control element (instead of using respective power supplies for the electrode and the control element), along with the control circuit that controls the control element, the electron gun can be made simpler yet can be effectively controlled to control electron beam emission to suit different applications.

In one embodiment of the first aspect, the control circuit is arranged to provide a variable resistance for changing the electric field provided by the control element.

In one embodiment of the first aspect, the control circuit comprises a first resistor and a second resistor electrically connected in series, and a switch connected across the second resistor. The switch is controlled to selectively open and close to change an equivalent resistance provided by the first resistor and the second resistor. The switch(es) may each include a photo-relay.

In one embodiment of the first aspect, the control circuit comprises a plurality of resistors each connected with a respective switch that is respectively controlled to selectively open and close to change an equivalent resistance provided by the plurality of resistors. Each of the switches may include a photo-relay.

In one embodiment of the first aspect, the control circuit comprises one or more further resistors operably connected with the first and second resistors and each connected with a respective switch. The switch(es) may each include a photo-relay.

In one embodiment of the first aspect, the electron gun further comprises an actuator operable by a user to provide an input to change the electric field provided by the control element; and a controller, operably connected with the actuator and the control circuit, for controlling the control circuit based on the received input.

In one embodiment of the first aspect, the electron gun further comprises a detector for detecting one or more properties of the emitted electron beam; and a controller operably connected with the detector and the control circuit for controlling the control circuit based on the one or more detected properties. The detector may be an imaging device. The controller may be implemented using one or more of: CPU, MCU, controllers, logic circuits, Raspberry Pi chip, etc.

In one embodiment of the first aspect, the control element comprises a Wehnelt element arranged around the electron emission element. The Wehnelt element may be in the form of a cap or a cylinder with a through hole that allows the emitted electron beam to pass.

In one embodiment of the first aspect, the electron gun further comprises a further power supply for activating the electron emission element. The further power supply may be a voltage supply.

In one embodiment of the first aspect, the electron emission element is a thermoionic electron emission element arranged to be heated to emit electrons. The thermoionic electron emission may be a metallic hairpin such as a tungsten hairpin, a Lanthanum Hexaboride ($LaB_6$) hairpin, or a Cerium Hexaboride ($CeB_6$) filament.

In one embodiment of the first aspect, the electron emission element is a field emission element arranged to be activated by an electric field to emit electrons. The field emission element may be a cold-cathode element or a Schottky element. One exemplary cold cathode element is made of single crystal tungsten sharpened to a tip. One exemplary Schottky element is made by coating a tungsten tip with a layer of zirconium oxide.

In accordance with a second aspect of the invention, there is provided an apparatus comprising the electron gun of the first aspect. The apparatus may be an electron microscope, such as a scanning electron microscope, a semiconductor inspection apparatus, a particle accelerator, etc.

In accordance with a third aspect of the invention, there is provided a method for operating the electron gun of the first aspect. The method includes controlling the control circuit to adjust an electric field provided by the control element.

In accordance with a fourth aspect of the invention, there is provided a method for operating the apparatus of the second aspect. The method includes controlling the control circuit to adjust an electric field provided by the control element.

BRIEF DESCRIPTION OF THE DRAWINGS

Embodiments of the invention will now be described, by way of example, with reference to the accompanying drawings in which:

FIG. 3 is a table showing the equivalent resistances that can be produced by the control circuit in FIG. 2.

DETAILED DESCRIPTION OF THE PREFERRED EMBODIMENT

Figure 1:
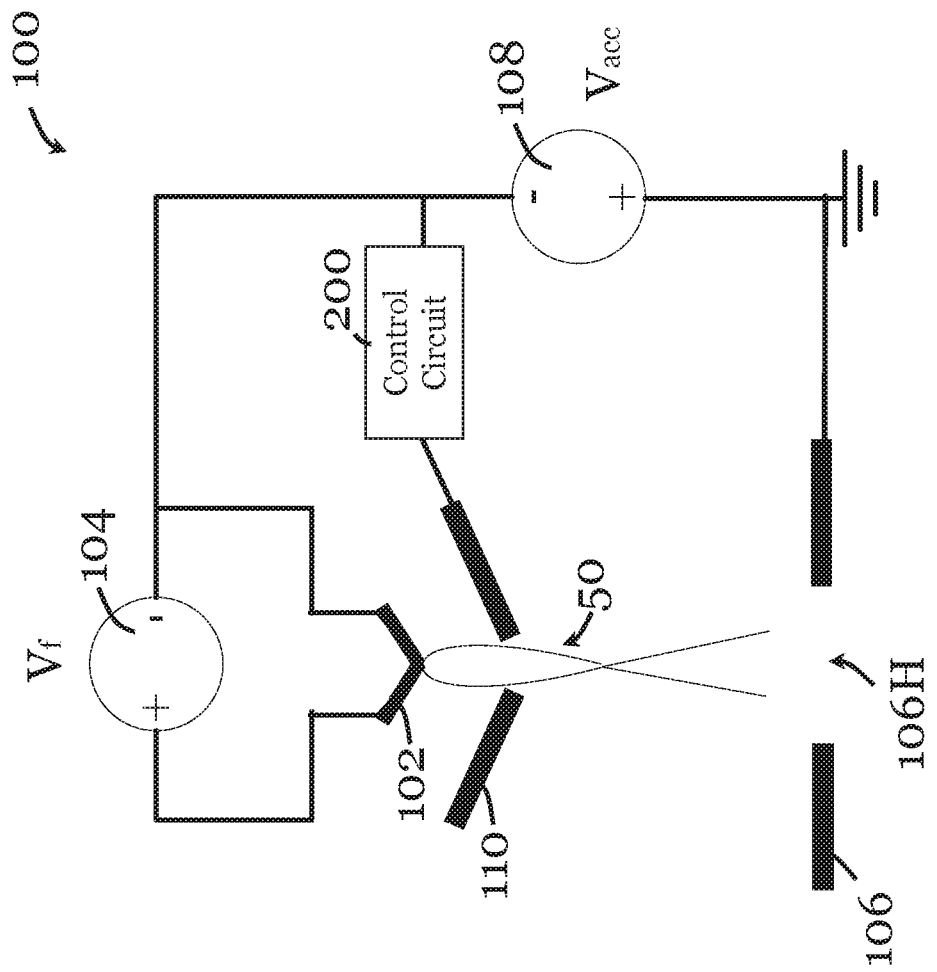
FIG. 1 is a schematic diagram of an electron gun in one embodiment of the invention.

FIG. 1 is a schematic diagram showing an electron gun 100 in one embodiment of the invention. The electron gun 100 illustrated is simplified to show only the main components of electron gun 100 relevant to the understanding of the invention. As shown in FIG. 1, the electron gun 100 includes an electron emission element in the form of a filament 102. The filament 102 is connected to a power supply 104 and acts as a cathode during operation. The power supply 104 is arranged to heat and hence activate the filament 102 to trigger electron beam 50 emission from the filament 102. An electrode 106, with a through hole 106H that allows the electron beam 50 to pass, is arranged downstream of the filament 102 (relative to the emitted electron beam). The electrode 106 is electrically connected with a high potential terminal of another power supply 108 such that the electrode 106 acts as an anode during operation. The electrode 106 provides an electric field that accelerates the emitted electron beam 50 towards the electrode 106 and adjusts the focuses of the beam 50.

A control element in the form of a Wehnelt cylinder 110 (schematically represented) is arranged between the filament 102 and the electrode 106. The Wehnelt cylinder 110 is connected with a control circuit 200, which in turn connects to a low potential terminal of the power supply 108. The Wehnelt cylinder 110 is arranged at an electric potential to provide an electric field to control emission of electron beams 50 from the filament 102. The Wehnelt cylinder 110 has a lower potential relative to the filament 102. The Wehnelt cylinder 110 generates an electric field to control the electron emission area of the filament 102 and to control the size or focus of the electron beam 50. The electric potential of the Wehnelt cylinder 110 (hence the electric field produced by the Wehnelt cylinder 110) can be changed by the control circuit 200 to change the electron emission area of the filament 102 and to change the size or focus of the electron beam 50. For example, the convergence or divergence of the emitted electron beam 50 can be controlled for different applications (e.g., for electron microscopy, for diffraction, etc.). A potential difference across the control circuit 200, i.e., the potential difference between the Wehnelt cylinder 110 and the filament 102, can be referred to as a bias voltage (which is variable).

In this embodiment, the high and low potential terminals of the power supply 104 are connected across the filament 102. The low potential terminal of the power supply 104 and the low potential terminal of the power supply 108 are directly connected with each other such that any circuit nodes directly between them (including one side of the control circuit 200) are at the same potential. The high potential terminal of the power supply 108 is connected to ground.

Figure 2:
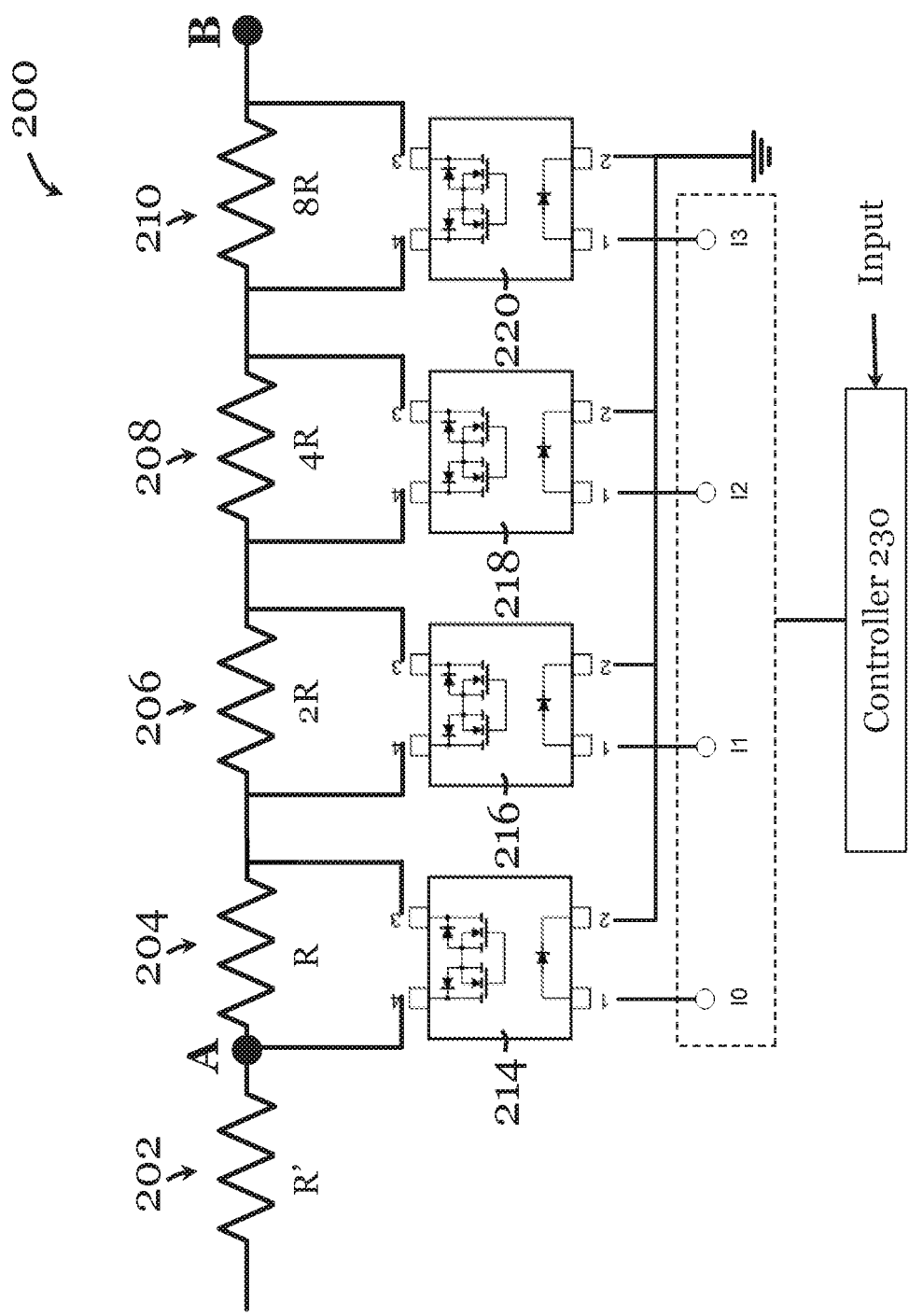
FIG. 2 is a circuit diagram of the control circuit in the electron gun of FIG. 1.

FIG. 2 illustrates the control circuit 200 of the electron gun 100. The control circuit 200 includes five resistors 202-210 connected in series. The first resistor 202 includes a resistance R', the second resistor 204 includes a resistance R, the third resistor 206 includes a resistance 2R, the fourth resistor 208 includes a resistance 4R, and the fifth resistor 210 includes a resistance 8R. The second to fourth resistors 204-210 are each respective connected with a respective switch 214-220 in the form of a photo-relay. The photo-relays are connected to a controller 230, which independently control the on/off of each of the switches 214-220, to adjust an equivalent resistance across the nodes A and B. The resulting equivalent resistances at different configurations (different on/off of the switches 214-220) are shown in FIG. 3. The change in equivalent resistance would then affect the bias voltage hence the electric potential of the Wehnelt cylinder 110.

In this embodiment, the controller 230 may be implemented using one or more of: CPU, MCU, logic circuit, Raspberry Pi chip, etc. The controller 230 is arranged to receive an input to make the change. The controller 230 may be connected with an actuator (not shown) operable by the user to provide the input to change the equivalent resistance. Alternatively, the controller may be connected with a detector for detecting one or more properties of the emitted electron beam to change the equivalent resistance.

The controller 230 may alternatively be implemented as an information handling system such as a computer. The information handling system may have different configurations, and it generally comprises suitable components necessary to receive, store, and execute appropriate computer instructions, commands, or codes. The main components of the information handling system are a processor and a memory 204. The processor may be formed by one or more CPU, MCU, controllers, logic circuits, Raspberry Pi chip, etc. The memory 204 may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer or information processing hardware capable of implementing the function described.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

For example, the electron emission element, the electrode, and the control element can be of different form, size, shape, and construction. The electron emission element can be activated by various means, e.g., electric field or heat (or both), to emit electron beams. The electron emission element, the electrode, and the control element can take any potential or voltage values so long as the potential of the control element is more negative than the potential of the electron emission element and the potential of the electrode is more positive than the potential of the electron emission element. The control circuit can include various means for adjusting the electric potential for the control element, including the variable resistance circuit illustrated. The variable resistance circuit can be constructed using different electronic components (resistors, capacitors, inductors, switches, etc.) arranged in a different electrical connections. The resistors need not be connected only in series. The number of resistors can be changed. A variable resistor may be used in addition to or in place of the resistor-and-photo-relay unit. The control of the control circuit by the user through actuator that receives a user input or by a detector that detects one or more properties of the emitted beam.

The invention claimed is:
1. An electron gun comprising:
an electron emission element arranged to be activated to emit electron beam;

an electrode arranged to be electrically connected with a power supply to accelerate the emitted electron beam;

a control element arranged to be electrically connected with the power supply to provide an electric field to control emission of electron beams from the electron emission element; and a control circuit electrically connected with the control element for changing the electric field provided by the control element;

wherein the control circuit is arranged to provide a variable resistance for changing the electric field provided by the control element; and wherein the control circuit comprises
a first resistor and a second resistor electrically connected in series, and
a switch connected across the second resistor,
wherein the switch is controlled to selectively open and close to change an equivalent resistance provided by the first resistor and the second resistor.

2. The electron gun of claim 1, wherein the switch comprises a photo-relay.

3. The electron gun of claim 1, wherein the control circuit comprises one or more further resistors operably connected with the first and second resistors and each connected with a respective switch.

4. The electron gun of claim 1, further comprising:
an actuator operable by a user to provide an input to change the electric field provided by the control element;
a controller, operably connected with the actuator and the control circuit, for controlling the control circuit based on the received input.

5. The electron gun of claim 1, further comprising:
a detector for detecting one or more properties of the emitted electron beam; and
a controller, operably connected with the detector and the control circuit, for controlling the control circuit based on the one or more detected properties.

6. The electron gun of claim 1, wherein the control element comprises a Wehnelt element arranged around the electron emission element.

7. The electron gun of claim 1, further comprising a further power supply for activating the electron emission element.

8. The electron gun of claim 1, wherein the electron emission element is a thermoionic electron emission element arranged to be heated to emit electrons.

9. The electron gun of claim 1, wherein the electron emission element is a field emission element arranged to be activated by an electric field to emit electrons.

10. An electron gun comprising:
an electron emission element arranged to be activated to emit electron beam;
an electrode arranged to be electrically connected with a power supply to accelerate the emitted electron beam;
a control element arranged to be electrically connected with the power supply to provide an electric field to control emission of electron beams from the electron emission element; and
a control circuit electrically connected with the control element for changing the electric field provided by the control element;
wherein the control circuit is arranged to provide a variable resistance for changing the electric field provided by the control element; and
wherein the control circuit comprises a plurality of resistors each connected with a respective switch that is respectively controlled to selectively open and close to change an equivalent resistance provided by the plurality of resistors.

11. An electron gun comprising:
an electron emission element arranged to be activated to emit electron beam;
an electrode arranged to be electrically connected with a power supply to accelerate the emitted electron beam;
a control element arranged to be electrically connected with the power supply to provide an electric field to control emission of electron beams from the electron emission element;
a control circuit electrically connected with the control element for changing the electric field provided by the control element;
an actuator operable by a user to provide an input to change the electric field provided by the control element; and
a controller, operably connected with the actuator and the control circuit, for controlling the control circuit based on the received input.

12. The electron gun of claim 11, wherein the control element comprises a Wehnelt element arranged around the electron emission element.

13. The electron gun of claim 11, further comprising a further power supply for activating the electron emission element.

14. The electron gun of claim 11, wherein the electron emission element is a thermoionic electron emission element arranged to be heated to emit electrons.

15. The electron gun of claim 11, wherein the electron emission element is a field emission element arranged to be activated by an electric field to emit electrons.

16. An electron gun comprising:
an electron emission element arranged to be activated to emit electron beam;
an electrode arranged to be electrically connected with a power supply to accelerate the emitted electron beam;
a control element arranged to be electrically connected with the power supply to provide an electric field to control emission of electron beams from the electron emission element;
a control circuit electrically connected with the control element for changing the electric field provided by the control element;
a detector for detecting one or more properties of the emitted electron beam; and
a controller, operably connected with the detector and the control circuit, for controlling the control circuit based on the one or more detected properties.

17. The electron gun of claim 16, wherein the control element comprises a Wehnelt element arranged around the electron emission element.

18. The electron gun of claim 16, further comprising a further power supply for activating the electron emission element.

19. The electron gun of claim 16, wherein the electron emission element is a thermoionic electron emission element arranged to be heated to emit electrons.

20. The electron gun of claim 16, wherein the electron emission element is a field emission element arranged to be activated by an electric field to emit electrons.

* * * * *